(12) United States Patent
Ikegami

(10) Patent No.: US 6,200,735 B1
(45) Date of Patent: Mar. 13, 2001

(54) METHOD FOR FORMING CONTACT HOLE BY DRY ETCHING

(75) Inventor: Naokatsu Ikegami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/185,094

(22) Filed: Nov. 3, 1998

(30) Foreign Application Priority Data

Apr. 7, 1998 (JP) .................................................. 10-094639
Apr. 9, 1998 (JP) .................................................. 10-097988

(51) Int. Cl.⁷ ................................. G03F 7/00; B44C 1/22
(52) U.S. Cl. ............................. 430/314; 430/317; 216/58
(58) Field of Search ..................................... 430/314, 317; 216/58

(56) References Cited

U.S. PATENT DOCUMENTS

| | | | |
|---|---|---|---|
| 4,180,432 | 12/1979 | Clark | 156/643 |
| 5,108,542 | 4/1992 | Lin | 156/643 |
| 5,302,236 * | 4/1994 | Tahara | 156/643 |
| 5,721,090 * | 2/1998 | Okamoto | 430/313 |
| 5,770,098 * | 6/1998 | Araki | 216/67 |
| 5,817,579 * | 10/1998 | Ko | 438/740 |
| 6,028,001 * | 2/2000 | Shin | 438/640 |

FOREIGN PATENT DOCUMENTS

| | | |
|---|---|---|
| 6-163475 | 6/1994 | (JP) . |
| 8-97186 | 4/1996 | (JP) . |
| 9-129611 | 5/1997 | (JP) . |
| 9-181047 | 7/1997 | (JP) . |

* cited by examiner

Primary Examiner—Mark F. Huff
Assistant Examiner—Nicole Barreca
(74) Attorney, Agent, or Firm—Jones Volentine, L.L.C.

(57) ABSTRACT

A method for forming a contact hole including forming a hole opening in a polysilicon film formed on an insulating film on the surface of a substrate; depositing a polysilicon film on the inner surface of the hole opening to make the diameter of the hole opening smaller; and carrying out dry etching to form an opening of the contact hole in the insulating film, using the polysilicon film as a mask. A gas mixture composed of $CHF_3$ and CO is used as an etching gas and a non-doped silicon oxide film is used as the insulating film.

5 Claims, 13 Drawing Sheets

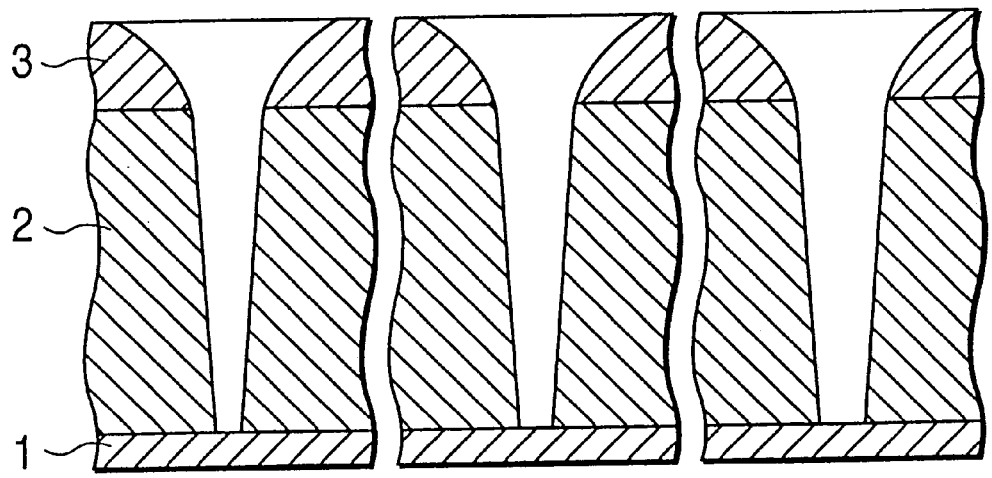

METHOD FOR FORMING CONTACT HOLE BY DRY ETCHING

BACKGROUND OF THE INVENTION

1. Field of the Invention

The present invention relates to a method for forming an opening of a contact hole in an insulating film on a semiconductor substrate in a semiconductor manufacturing process and, more particularly, to a method for forming a micro contact hole or the like having an opening diameter of 0.2 µm or less, or 0.1 µm or less by using an anisotropic dry etching process.

2. Description of Related Art

There has been a markedly increasing trend toward higher integration of semiconductor IC devices. In achieving higher integration, microminiaturization of patterns is mandatory. For this reason, diverse microprocessing techniques for creating microminiature patterns have been developed. In the dry etching technique, which is as important as the photolithography technique among the microprocessing techniques, when creating a pattern that is microminiature and that has a high aspect ratio (the ratio of the depth to the diameter or width of an opening), the etching speed normally drops as the aspect ratio increases. The drop in etching speed due to an increase in the aspect ratio, however, can be controlled; hence, there have been developed methods that enable stable plasma discharge in higher vacuum environment. For example, apparatuses have been developed that employ the electron cyclotron resonance (ECR), the inductively coupled plasma (ICP), helicon wave plasma, etc. These apparatuses are able to generate high-density plasma in a high-vacuum environment, e.g. 10 [mTorr] or less, making it possible to etch further microminiature patterns. This type of dry etching makes use of the chemical reaction among active particles in the plasma produced by applying a high frequency electric field to an introduced gas, and it makes it possible to configure a perpendicular opening of a microminiature contact hole or the like.

FIGS. 11A through 11E are sketch drawings, illustrative of the steps in sequence for forming a contact hole having a microminiature opening diameter of 0.2 µm or less by the dry etching process in which such a high-vacuum environment and high-density plasma are employed. The process illustrated in FIGS. 11A through 11E forms contact hole opening patterns by using a polysilicon mask instead of the photoresist mask that has been conventionally used. The contact hole is created according to steps (1) through (5) set forth below.

(1) Step shown in FIG. 11A

By using the chemical vapor deposition (CVD), a CVD insulating film 2' composed of a silicon oxide having a film thickness of 500 to 1500 nm and a first polysilicon film (Poly-Si film) 3' having a film thickness of 150 to 300 nm are formed on the surface of a silicon substrate 1' in the order they are listed. After that, a photoresist mask 4' having a first hole opening 4a' created by the photolithography process is formed. The minimum diameter of the first hole opening 4a' that can be formed in the photoresist mask 4' is approximately 0.25 µm, which is considered to be the limitations with the current photolithography.

(2) Step shown in FIG. 11B

In this step, with the photoresist mask 4' used as the mask, the first polysilicon film 3' is subjected to selective anisotropic etching by high-density plasma in a high-vacuum environment to form a second hole opening 3a' in the first polysilicon film 3'. At this time, the second hole opening 3a' formed in the first polysilicon film 3' has substantially the same opening diameter, namely, approximately 0.25 µm, as the first hole opening 4a'.

(3) Step shown in FIG. 11C

In this step, the photoresist mask 4' is removed by a resist removing process, then a second polysilicon film 5' is deposited to a thickness of 100 to 150 nm on the surface of the first polysilicon film 3' and the inner surface of the second hole opening 3a' formed in the first polysilicon film 3'.

(4) Step shown in FIG. 11D

In this step, anisotropic etching is carried out in the direction perpendicular to the surface of the second polysilicon film 5' so as to leave the second polysilicon film 5' only on the inner wall surface of the second hole opening 3a' formed in the first polysilicon film 3'. Leaving the second polysilicon film 5' only on the inner wall surface of the second hole opening 3a' makes it possible to form a third hole opening 5a' that has a smaller opening diameter than the second hole opening 3a'. For instance, if the film thickness of the second polysilicon film 5' is 100 nm, then the diameter of the third hole opening 5a' is approximately 0.05 µm.

(5) Process shown in FIG. 11E

In the last step, the first polysilicon film 3', in which the third hole opening 5a' of a smaller opening diameter than the second hole opening 3a' has been formed, is used as the mask, and the CVD insulating film 2' is subjected to anisotropic etching by the high-density plasma in the high-vacuum environment. This makes it possible to form a contact hole (opening) 2a' having a further smaller opening diameter 0.05 µm than the opening diameter 0.25 µm of the second hole opening 3a'.

The conventional process, however, poses the following problem. First, when a microminiature opening with a high aspect ratio is subjected to the anisotropic etching while using the high-density plasma in the high-vacuum environment, an abnormal etching configuration is produced in the vicinity of the surface of a specimen. For example, when a microminiature pattern of 0.2 µm or less is etched in the etching process of the opening such as a contact hole, a configuration defect known as "bowing" occurs.

FIG. 12 is a schematic representation illustrative of the configuration defect, bowing, that has taken place in the contact hole 2a' formed in the step of FIG. 11E. To be more specific, when a BPSG film is used as the CVD insulating film 2', the bowing occurs in which the middle portion of the contact hole 2a' expands like a bow. As a result, an opening diameter Tb of the middle portion of the contact hole 2a' formed in the CVD insulating film 2' becomes larger than the opening diameter or the mask opening diameter Tm of the third hole opening 5a' formed in the inner wall surface of the second hole opening 3a' of the second polysilicon film 3 with the second polysilicon film 5' left thereon. The bowing problem is considered to be attributable to the following. In plasma that has been separated to electrons and ions, when the electrons and ions are radiated to the surface of a mask on which a pattern is to be formed, the difference between the amount of the electrons and the amount of the ions incident upon the microminiature pattern causes electrification in the vicinity of the surface of the pattern. Thus, the course of the incident ions is warped, causing the ions to bump against the middle portion of the wall surface of the contact hole 2a', etching the middle portion.

As illustrated in FIG. 12, if the maximum value of the opening diameter of the contact hole 2a' formed by the etching process is denoted as Tb, and the distance from the mask (the surface of the CVD insulating film 2') at the position where the opening diameter reaches the maximum value Tb, i.e. the bowing position, is denoted as H, then the maximum value Tb of the opening diameter and the distance H vary according to etching conditions. For instance, if the etching pressure is set high, then the maximum value Tb of the opening diameter decreases, while the distance H increases. When the mask opening diameter Tm is relatively large (0.3 µm or more), the bowing problem can be controlled so that it develops into no noticeable practical problem by setting proper etching conditions. If, however, the mask opening diameter Tm decreases to 0.2 µm or less, then an increase in the relative dimensional ratio of the maximum value Tb of the opening diameter with respect to the mask opening diameter Tm becomes no longer negligible, leading to a problem. In a typical problem, the distance between a wiring layer passing beside a hole and the hole becomes shorter, possibly causing the electrodes thereof formed at the opening to come in contact.

There is another problem with the conventional process in that etching is stopped at a certain depth in a hole (known as "etching stop") while etching. FIG. 13 is a graph showing the relationship between the etching time and the etching depth in the contact hole 2a' when the mask height of the first polysilicon film 3' is 600 nm in the contact hole forming process described in conjunction with FIG. 11. In this example, the etching was performed using the magnetron RIE system and a gas mixture of $CHF_3$ and CO and at a pressure of 35 mTorr. The hole size was checked on a 0.07-µm diameter, 0.1-µm diameter, 0.12-µm diameter, and 0.14-µm diameter, respectively. As it can be seen from FIG. 13, when the etching time exceeds one minute, the etching depth suddenly decreases; the etching proceeds no deeper than 1.0 µm particularly in the case of a hole having a diameter of 0.1 µm or less.

SUMMARY OF THE INVENTION

Accordingly, it is an object of the present invention to provide a method that enables the opening of a contact hole to be formed without such a problem as bowing or etching stop, and more particularly to provide a method best suited for forming a microminiature contact hole having an opening diameter of 0.2 µm or less, or 0.1 µm or less.

To this end, according to one aspect of the present invention, there is provided a method for forming an opening of a contact hole or the like in an insulating film by: forming a hole opening in a polysilicon film formed on the insulating film on the surface of a substrate; depositing polysilicon on the inner surface of the hole opening to make the diameter of the hole opening smaller; and carrying out dry etching, using the polysilicon film as a mask; wherein a gas mixture of $CHF_3$ and CO is used as the etching gas and a non-doped silicon oxide film is used as the insulating film.

In a preferred form, the temperature of the substrate during the contact hole etching is 50 degrees Celsius or higher.

According to another aspect of the present invention, there is provided a method for forming an opening of a contact hole or the like in an insulating film by: forming a hole opening in a photoresist mask formed on the insulating film on the surface of a substrate; depositing polysilicon on the inner surface of the hole opening; and carrying out dry etching; wherein a gas mixture of $C_4F_8$, $O_2$, and Ar is used as the etching gas, and the mixing ratio of the Ar gas in the etching gas is 90 flow percent (%) or more.

In another preferred form, the temperature of the substrate during the contact hole etching is zero degree Celsius or lower.

In yet another preferred form, the etching is carried out under a condition where the concentration of C of a polymer film deposited on a side wall of the opening is $1 \times 10^{15}$ cm$^{-2}$ or less and the F/C ratio at the side wall of the opening is 1 or more.

BRIEF DESCRIPTION OF THE DRAWINGS

FIGS. 5A through 5C are sectional views of the configuration of the hole etched at the substrate temperature of −15° C. (5A), 20° C. (5B), and 60° C. (5C), respectively, in a second embodiment, the sectional view being observed by an SEM;

FIGS. 7A and 7B are graphs illustrating the surface density (cm$^{-2}$) of the polymer film of C and F, wherein FIG. 7A shows the distribution of C and FIG. 7B shows the distribution of F in the direction of the depths of the contact holes having various opening diameters;

FIGS. 9A and 9B are sectional views, wherein FIG. 9A shows a contact hole having a diameter of 0.14 µm and FIG. 9B shows a contact hole having a diameter of 0.06 µm observed under an SEM;

DETAILED DESCRIPTION OF THE PREFERRED EMBODIMENTS

The embodiments of the present invention will now be described in conjunction with the accompanying drawings. FIGS. 1A through 1E illustrate a first embodiment of the invention; they are schematic drawings showing the steps in sequence for preventing processing defects such as bowing when forming a contact hole by the dry etching process that involves high-vacuum environment and high-density plasma. This method is suited especially for forming a contact hole having a microminiature opening diameter of 0.2 μm or less. The process illustrated in FIGS. 1A through 1E is the contact hole opening pattern type method employing the polysilicon mask as in the case of the method previously described in conjunction with FIG. 11. The contact hole is produced according to steps (1) through (5) set forth below.

Figure 1A:
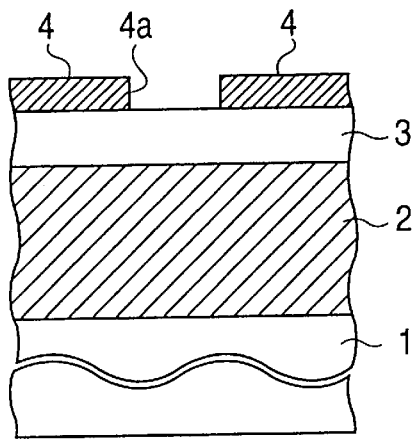
FIGS. 1A through 1E are schematic drawings illustrative of the steps of the process in sequence of a first embodiment of the present invention.

(1) Step shown in FIG. 1A

By using the chemical vapor deposition (CVD), a CVD insulating film 2 composed of a silicon oxide having a film thickness of 500 to 1500 nm and a first polysilicon film (Poly-Si film) 3 having a film thickness of 150 to 300 nm are formed on the surface of a silicon substrate 1 in the order they are listed. After that, a photoresist mask 4 having a first hole opening 4a created by the photolithography process is formed. In this embodiment, a non-doped CVD oxide film that does not contain impurities such as phosphorus (P) or boron (B) is used for the CVD insulating film 2. The minimum diameter of the first hole opening 4a that can be formed in the photoresist mask 4 is approximately 0.25 μm.

Figure 1D:
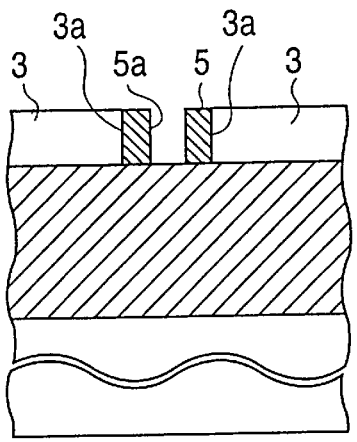
Figure 1B:
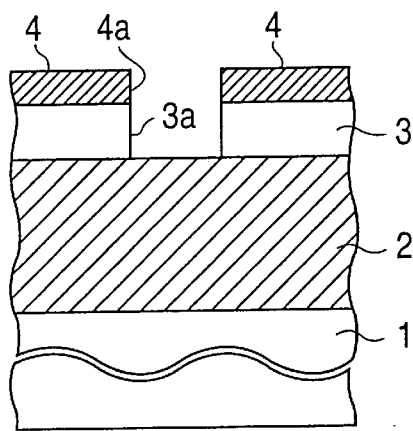

(2) Step shown in FIG. 1B

In this step, with the photoresist mask 4 used as the mask, the first polysilicon film 3 is subjected to selective anisotropic etching by high-density plasma in a high-vacuum environment to form a second hole opening 3a in the first polysilicon film 3. At this time, the second hole opening 3a formed in the first polysilicon film 3 has substantially the same opening diameter, namely, approximately 0.25 μm, as the first hole opening 4a.

Figure 1E:
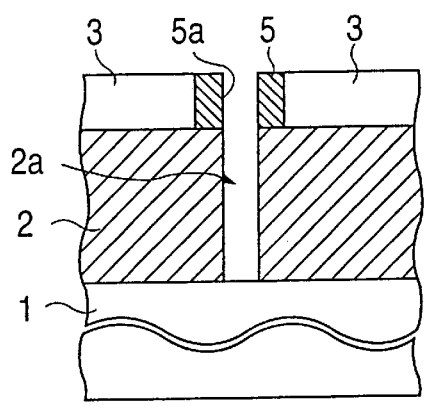
Figure 1C:
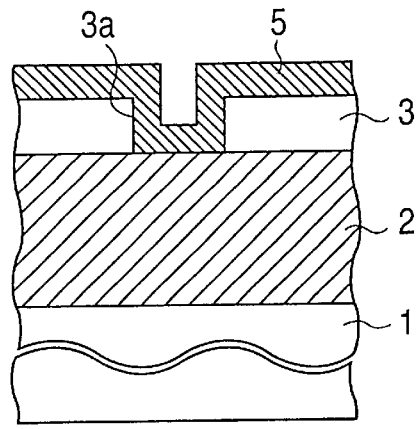

(3) Step shown in FIG. 1C

In this step, the photoresist mask 4 is removed by a resist removing process, then a second polysilicon film 5 is deposited to a thickness of 100 to 150 nm on the surface of the first polysilicon film 3 and the inner surface of the second hole opening 3a formed in the first polysilicon film 3.

(4) Step shown in FIG. 1D

In this step, anisotropic etching is carried out in the direction perpendicular to the surface of the second polysilicon film 5 so as to leave the second polysilicon film 5 only on the inner wall surface of the second hole opening 3a formed in the first polysilicon film 3. Leaving the second polysilicon film 5 only on the inner wall surface of the second hole opening 3a makes it possible to form a third hole opening 5a that has a smaller opening diameter than the second hole opening 3a. For instance, if the film thickness of the second polysilicon film 5 is 100 nm, then the diameter of the third hole opening 5a is approximately 0.05 μm.

(5) Process shown in FIG. 1E

In the last step, the first polysilicon film 3, in which the third hole opening 5a of a smaller opening diameter than the second hole opening 3a has been formed, is used as the mask, and the CVD insulating film 2 is subjected to anisotropic etching by the high-density plasma in the high-vacuum environment. By using a gas mixture of $CHF_3$ and CO as the etching gas and a non-doped silicon oxide film as the CVD insulating film 2, a contact hole (opening) 2a having a further smaller opening diameter 0.05 μm than the opening diameter 0.25 μm of the second hole opening 3a can be formed without the occurrence of the bowing problem.

On the other hand, as described with reference to FIG. 1, when etching the CVD insulating film 2 composed of the non-doped silicon oxide film by using the gas mixture of $CHF_3$ and CO as the etching gas, the contact hole 2a is inevitably tapered although the occurrence of the bowing is prevented.

The tapered configuration develops into no serious problem as long as the opening of the contact hole 2a has a certain diameter or larger; however, it may cause the diameter of the hole bottom to be extremely small when making a microminiature opening that has a hole diameter of 0.1 μm or less. This may result in an increased contact resistance.

To prevent such tapering, it is preferable to set the temperature of the substrate at 50 degrees Celsius or higher while etching the CVD insulating film 2 in the step illustrated in FIG. 1E. This makes it possible to perpendicularly machine the contact hole 2a, enabling the microminiature hole pattern having an opening diameter of 0.1 μm or less to be achieved. If a conventional typical photoresist mask is used as the etching mask, "resist scorching" or "deformation of resist" may occur at the etching temperature of 50 degrees Celsius or above, adversely affecting the etching characteristics. As described in this embodiment, however, the problems of "resist scorching" or "deformation of resist" will not take place since the first polysilicon film 3 is used as the mask.

In the first embodiment set forth above, when the opening diameter of the contact hole decreases to about 0.1 μm or less, e.g. about 0.05 μm, the etch rate rapidly drops, frequently causing the etching to stop in the middle, which is known as "etch stop." A second embodiment provides a solution to the etch stop problem, and it provides a method that makes it possible to produce a contact hole having a microminiature opening diameter as small as approximately 0.05 μm.

FIGS. 2A through 2E illustrate a second embodiment of the invention; they are schematic drawings illustrative of the steps in sequence for preventing processing defects such as the etch stop when forming a contact hole by the dry etching process that involves high-vacuum environment and high-density plasma. This method is suited especially for forming a contact hole having a microminiature opening diameter of 0.1 μm or less. The process illustrated in FIGS. 2A through 2E is the contact hole opening pattern type method employing the polysilicon mask as in the case of the method previously described in conjunction with FIG. 1 and FIG. 11. The contact hole is produced according to steps (1) through (5) set forth below.

Figure 2A:
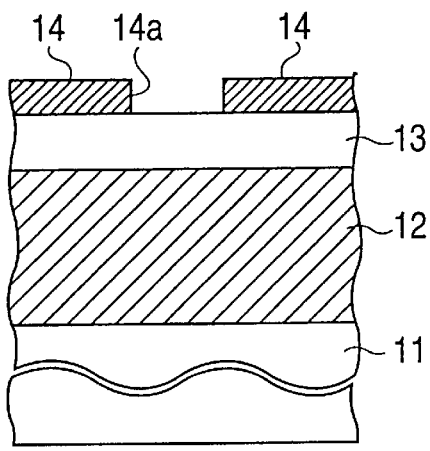
FIGS. 2A through 2E are schematic drawings illustrative of the steps of the process in sequence of a second embodiment of the present invention.

(1) Step shown in FIG. 2A

By using the chemical vapor deposition (CVD), a CVD insulating film 12 composed of a silicon oxide having a film thickness of 500 to 1500 nm and a first polysilicon film (Poly-Si film) 13 having a film thickness of 150 to 300 nm are formed on the surface of a silicon substrate 11 in the order they are listed. After that, a photoresist mask 14 having a first hole opening 14a created by the photolithography process is produced. In the second embodiment, a CVD oxide film or BPSG film containing impurities such as phosphorus (P) or boron (B), or a non-doped CVD oxide film that does not contain such impurities may be used for the CVD insulating film 12. The minimum diameter of the first hole opening 14a is approximately 0.25 μm.

Figure 2B:
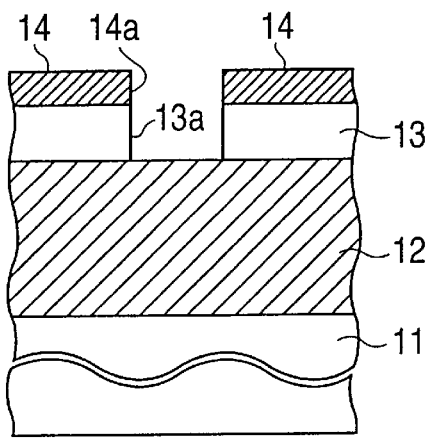

(2) Step shown in FIG. 2B

In this step, with the photoresist mask 14 used as the mask, the first polysilicon film 13 is subjected to selective anisotropic etching by high-density plasma in a high-vacuum environment to form a second hole opening 13a in the first polysilicon film 13. At this time, the second hole opening 13a has substantially the same opening diameter, namely, approximately 0.25 μm, as the first hole opening 14a.

Figure 2C:
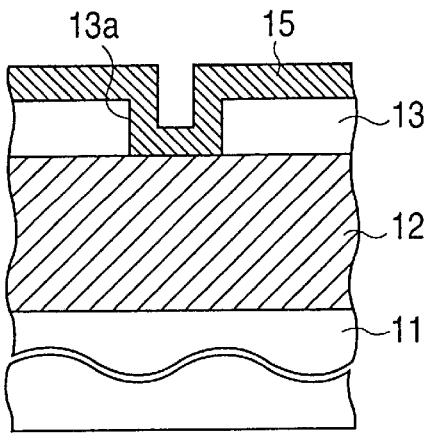

(3) Step shown in FIG. 2C

In this step, the photoresist mask 14 is removed by a resist removing process, then a second polysilicon film 15 is deposited to a thickness of 100 to 150 nm on the surface of the first polysilicon film 13 and the inner surface of the second hole opening 13a.

Figure 2D:
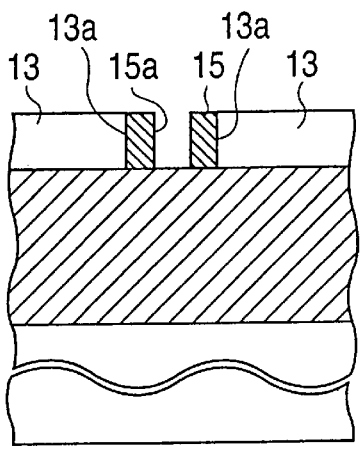

(4) Step shown in FIG. 2D

In this step, anisotropic etching is carried out in the direction perpendicular to the surface of the second polysilicon film 15 so as to leave the second polysilicon film 15 only on the inner wall surface of the second hole opening 13a formed in the first polysilicon film 13. This makes it possible to form a third hole opening 15a that has a smaller opening diameter than the second hole opening 13a. For instance, if the film thickness of the second polysilicon film 15 is 100 nm, then the diameter of the third hole opening 15a is approximately 0.05 µm.

Figure 2E:
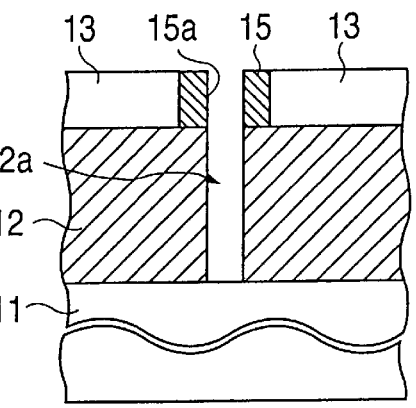

(5) Process shown in FIG. 2E

In the last step, the first polysilicon film 13, in which the third hole opening 15a of a smaller opening diameter than the second hole opening 13a has been formed, is used as the mask, and the CVD insulating film 12 is subjected to anisotropic etching by the high-density plasma in the high-vacuum environment. In this embodiment, a gas mixture composed of $C_4F_8$, $O_2$, and Ar is used as the etching gas, the mixing ratio of the Ar gas in the etching gas being 90 flow percent (%) or more. By using the gas mixture composed of $C_4F_8$, $O_2$, and Ar, in which the mixing ratio of the Ar gas in the etching gas is 90 flow percent (%) or more, a contact hole (opening) 12a having a further smaller opening diameter 0.05 µm can be formed without the occurrence of the etch stop problem when anisotropically etching the CVD insulating film 12. In addition, when the gas mixture composed of $C_4F_8$, $O_2$, and Ar, in which the mixing ratio of the Ar gas in the etching gas is 90 flow percent (%) or more is used, the C concentration of a polymer film deposited on the side wall of the contact hole (opening) 12a formed by etching becomes $1 \times 10^{15}$ cm$^{-2}$ or less and the F/C ratio at the side wall of the contact hole (opening) becomes 1 or more.

On the other hand, as described in conjunction with FIG. 2, when etching with the gas mixture composed of $C_4F_8$, $O_2$, and Ar, in which the mixing ratio of the Ar gas in the etching gas is 90 flow percent (%) or more, the selectivity with respect to the polysilicon mask is extremely low. This poses a problem in that, with an increasing depth of the contact hole, the mask will be damaged and the opening undesirably spreads laterally before the bottom of the hole is reached.

To prevent the damage to the polysilicon mask, it is preferable to set the temperature of the substrate to zero degree Celsius or below while etching the CVD insulating film 2 in the step described in conjunction with FIG. 2E. This makes it possible to etch a microminiature contact hole having an opening diameter, for example, of 0.05 µm to a depth of about 1.0 µm.

In order to confirm the advantages of the present invention, working examples have been implemented, the results of which are given below.

Working example 1 will be described first. According to the process of the first embodiment in accordance with the present invention, a contact hole was produced. A reactive ion etching (RIE) apparatus was used as the etching apparatus and a gas mixture composed of $CHF_3$ and CO ($CHF_3$/CO=30/170 (sccm)) was used as the etching gas of a pressure of 35 mTorr to perform etching at a substrate temperature of 20 degrees Celsius. The formed contact hole was observed under a scanning electron microscope (SEM). The sectional configurations observed are shown in FIG. 3 illustrative of the working example, and FIG. 4 illustrative of a comparative example.

Figures 3A, 3B, 3C:
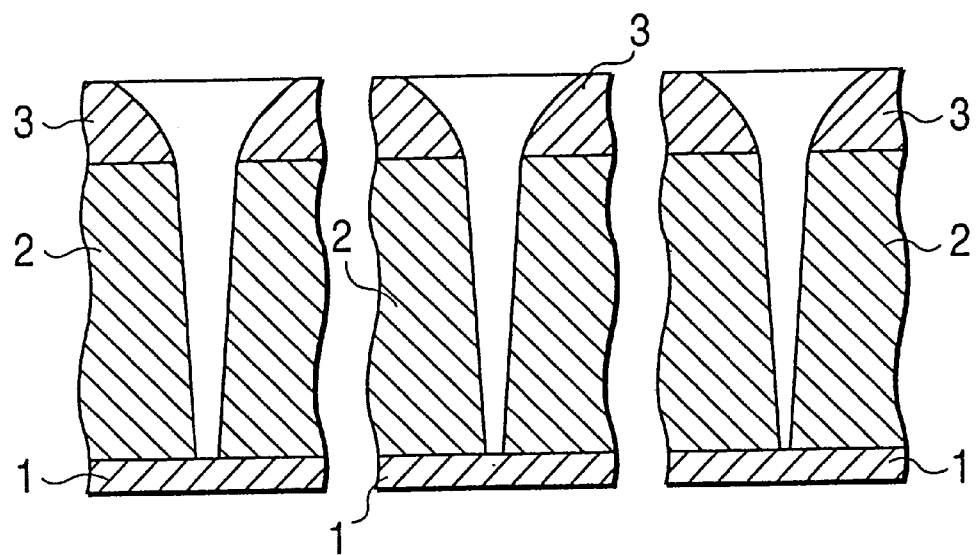
FIGS. 3A through 3C are sectional views of a contact hole formed in the first embodiment observed under a scanning electron microscope (SEM)

In the working examples shown in FIG. 3, a non-doped silicon oxide film containing no impurities such as phosphorus (P) or boron (B) serving as a CVD insulating film 2 formed on the surface of a silicon substrate 1 was etched with a first polysilicon film 3 used as the mask. The opening diameter was 0.18 µm in FIG. 3A, 0.14 µm in FIG. 3B, and 0.08 µm in FIG. 3C, respectively. In working example 1, the contact hole was formed without the occurrence of bowing. The tapering angle of the contact hole was 87 degrees in FIG. 3A, 88 degrees in FIG. 3B, and 89 degrees in FIG. 3C, respectively.

Figures 4A, 4B, 4C, 4D:
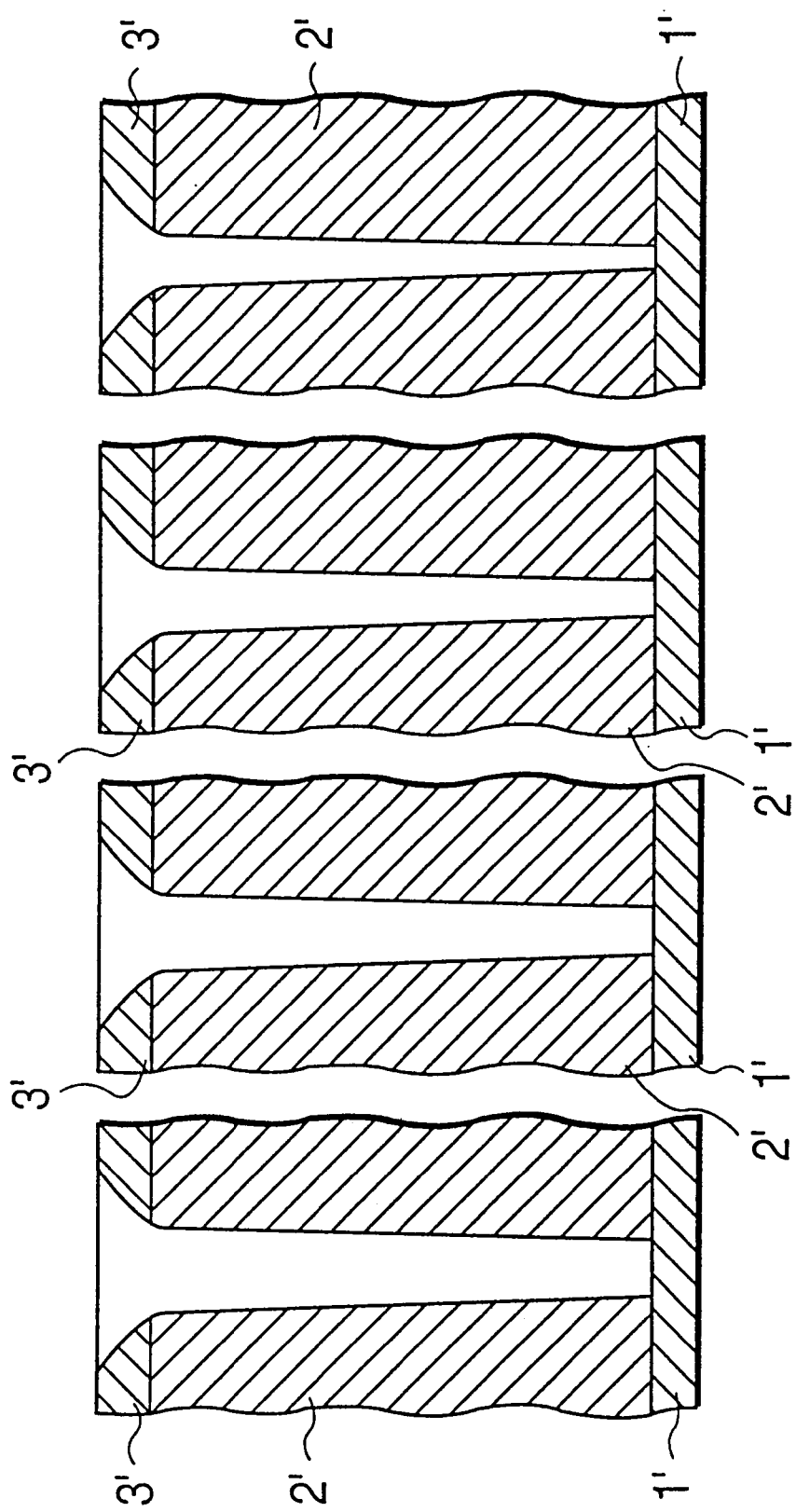
FIGS. 4A through 4D are sectional views of a contact hole formed as a comparative example of the first embodiment, the contact hole being observed under a scanning electron microscope (SEM)

In the comparative examples shown in FIG. 4, a CVD insulating film 2' composed of BPSG formed on the surface of a silicon substrate 1' was etched using a first polysilicon film 3' as the mask. The opening diameter was 0.25 µm in FIG. 4A, 0.23 µm in FIG. 4B, 0.21 µm in FIG. 4C, and 0.15 µm in FIG. 4D. In these comparative examples, the occurrence of the bowing was not observed. The selectivity (selectivity to the silicon substrate) was infinite (deposition) in FIGS. 4A and 4B, 27 in FIG. 4C, and 9.4 in FIG. 4D, respectively.

Working example 2 will now be described. Working example 1 has indicated that the occurrence of the bowing can be prevented by etching the CVD insulating film composed of the non-doped silicon oxide film by using the gas mixture of $CHF_3$ and CO. As shown in FIG. 3, however, using this type of gas produces the tapered contact hole although it prevents the bowing. The tapered configuration does not lead to a serious problem as long as the hole diameter has a certain level of size; however, it presents a problem of an increased contact resistance if the hole diameter is decreased to 0.1 µm or less since the tapered configuration causes the diameter of the hole bottom to become extremely small. In working example 2 of the present invention, the electrodes of the substrate were heated to 50 degrees Celsius or above to successfully accomplish the perpendicular processing, making it possible to form a microminiature hole pattern having a diameter of 0.1 µm or less.

A CVD insulating film 2 on the surface of a silicon substrate 1 shown in FIG. 5 was etched to form a contact hole having an opening diameter (hole top size) of 0.18 µm according to the process of the first embodiment in accordance with the present invention. In this working example, the etching was performed using a first polysilicon film 3 as the mask and a gas mixture composed of $CHF_3$ and CO ($CHF_3$/CO=30/170 (sccm)). FIG. 5 gives the sectional views of the hole configurations produced by etching at different substrate temperatures, the hole configurations being observed under an SEM; the substrate temperature was at −15 degrees Celsius in FIG. 5A, 20 degrees Celsius in FIG. 5B, and 60 degrees Celsius in FIG. 5C, respectively. The taper angle is 86 degrees in FIG. 5A, 87 degrees in FIG. 5B, and 89.5 degrees in FIG. 5C, respectively. It is understood that the taper angle gradually approaches perpendicular as the substrate temperature rises. Experiments have revealed that the perpendicular processing can be achieved especially at the substrate temperature of 50 degrees Celsius or above in the etching that employs the gas mixture of $CHF_3$ and CO. If the etching is performed at this temperature when using a regular photoresist mask, the resist scorching, deformed resist or the like occurs, adversely affecting the etching characteristics. In this working example, however, such problems do not occur since it employs the polysilicon mask.

Figure 6:
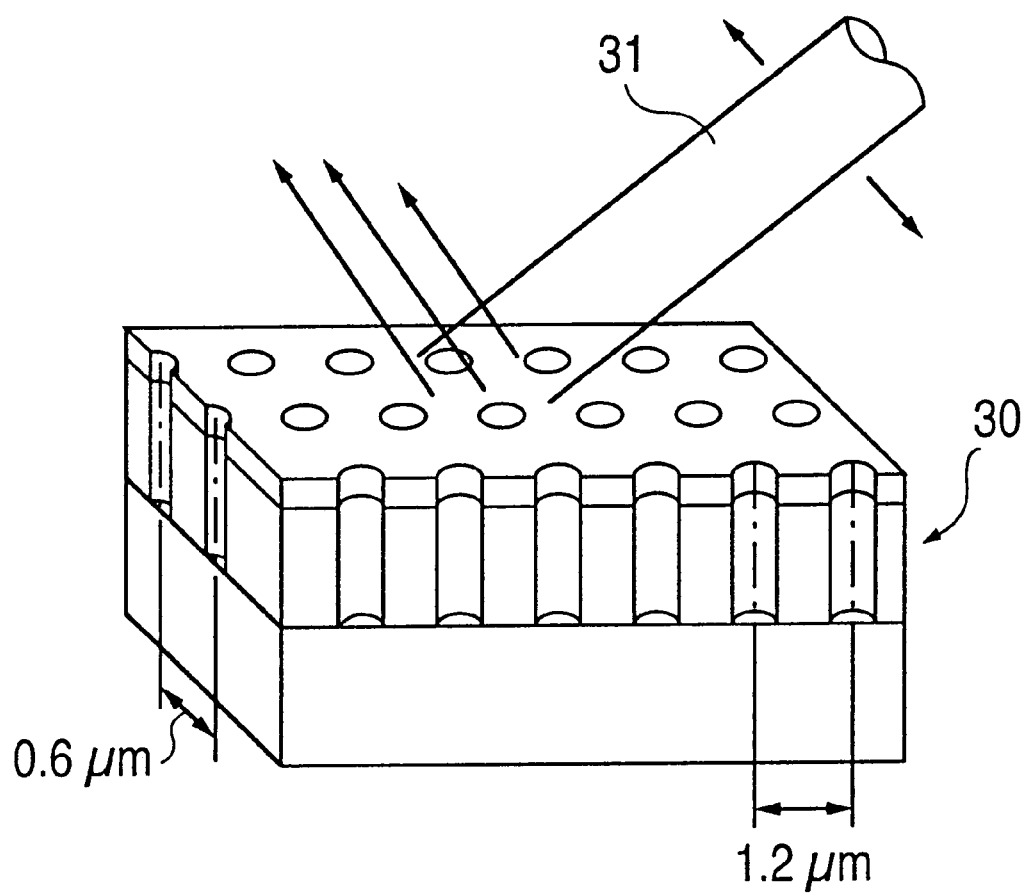
FIG. 6 is a schematic representation of the structure of a sample and a measurement method for measuring a polymer film in the hole by using a SIMS.

Working example 3 will now be described. Before describing working example 3, however, the following will be discussed. Studies were carried out on the distribution of the film constituents and film thickness of the fluorocarbon polymer film, which has been deposited on the surfaces of the hole including the side wall and bottom surfaces, in the direction of the hole depth when the contact hole is etched using the gas mixture of $CHF_3$ and CO in working examples 1 and 2. The deposition distribution of the polymer film reflects the changes in the behavior of the ions entering the holes or of fluorocarbon radicals in the direction of the hole depth; it is considered to have an extremely close relationship with the etching characteristics. FIG. 6 is a schematic representation showing the structure of a sample and a measurement method when performing measurement on the polymer films in the holes by using a secondary-ion mass spectroscopy (SIMS). As shown in FIG. 6, the distribution of the deposited polymer film can be checked by scanning the surface of a sample 30 with an ion beam ($O_2$+primary ion beam) 31 in the SIMS.

Use of this technique has enabled the analysis of the polymer film in the holes, which was not possible in the past. The secondary ion count number of C and F measured using this technique, and the concentration ($cm^{-3}$) that has been calibrated using a standard $SiO_2$ sample produced by ion-implanting F and C of a known concentration vary depending on the absolute value of the quantity of the polymer film. This means that these values vary depending on the hole diameter in addition to the thickness of the deposited film in the hole. Therefore, the foregoing secondary ion count number and concentration were converted to surface density in order to examine the distribution of the thickness and constituents of the polymer film deposited in the holes having different diameters by eliminating the influences of the hole diameter.

Figure 7A:
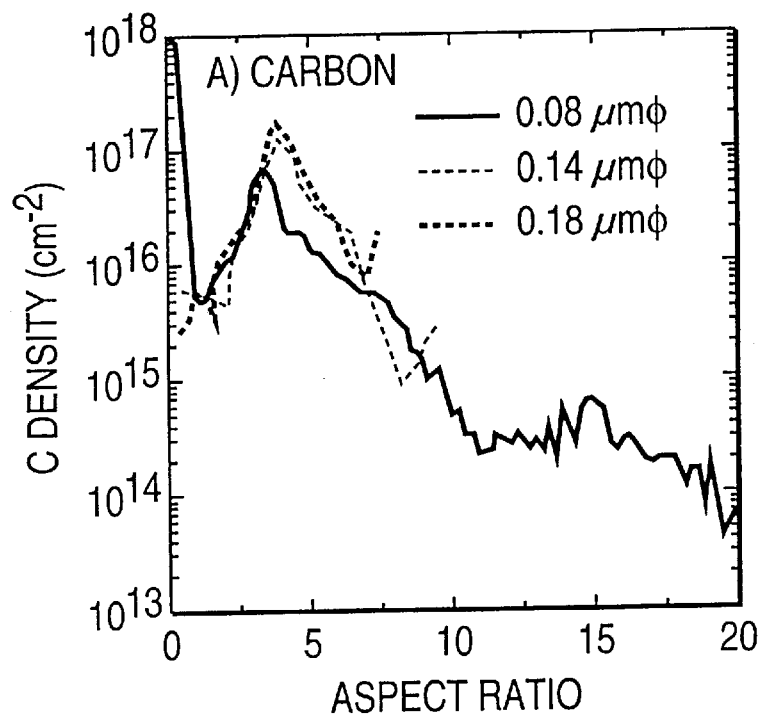
Figure 7B:
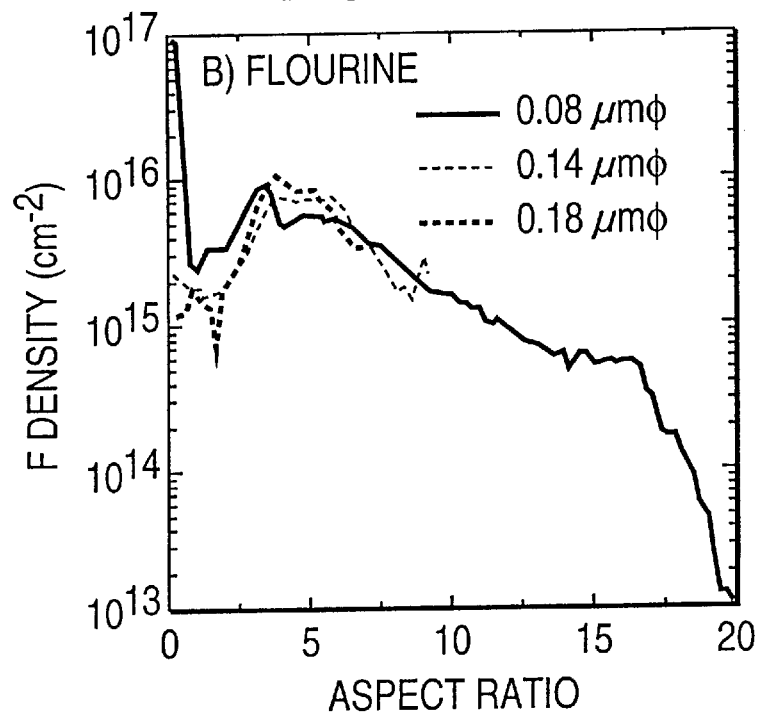

FIG. 7 shows the polymer film surface densities ($cm^{-2}$) of C and F calculated as described above, wherein FIG. 7A indicates the distribution of C and FIG. 7B indicates the distribution of F in the direction of the hole depth in relation to contact holes of different opening diameters. The abscissas denote an aspect ratio $\omega/D$ ($\omega$=Mask height+Etching depth; D=Hole diameter) in place of the hole depth. The opening diameters of the contact holes are 0.18 $\mu$m, 0.14 $\mu$m, and 0.08 $\mu$m, respectively.

As it is understood from FIG. 7, when the etching was carried out on an NSG film at 20 degrees Celsius with a gas mixture composed of $CHF_3$ and CO, the profiles of F and C closely matched despite the changes of the opening diameter, and the surface densities of F and C are determined only by the aspect ratio. Further, the surface densities of F and C are extremely high; the surface density of C (the concentration of C) on the hole side wall in the vicinity of the aspect ratio of 4 is of the order of $10^{17}$ or less, which is equivalent to a few hundreds of angstroms in terms of film thickness. The F/C ratio in the vicinity of the aspect ratio of 4 was calculated; the calculation result was approximately 0.1, indicating that the film has been almost carbonized. Thus, it has been found that this extremely thick film with the high concentration of C piles up on the hole side wall to protect the hole side wall from the ions bumping against it, thereby preventing the bowing.

It is further considered that such a powerful side wall protection effect causes the tapered contact hole in working example 1 wherein the substrate temperature was set to 20 degrees Celsius. In working example 2 wherein the substrate temperature was set to 50 degrees Celsius or above, the accumulation of a large amount of the polymer film on the side wall was suppressed and the opening was shifted from the taper configuration to the perpendicular configuration. On the other hand, however, it has been found that the accumulation of the polymer film is shifted to the hole bottom during the etching and interferes with the etching reaction, frequently resulting in the etch stop.

Hence, it is considered that the perpendicular processing can be accomplished with a minimized chance of the occurrence of the etch stop even for a hole as small as 0.05 $\mu$m if the polymer film accumulated on the side wall of the hole can be controlled to a minimum, the number of the ions colliding with the hole side wall can be also controlled to a minimum, and ions with good perpendicular directivity can be entered in the hole. The following will describe working example 3 that employs a gas mixture composed of $C_4F_8$, $O_2$, and Ar as the means for achieving such perpendicular processing.

Figure 8A:
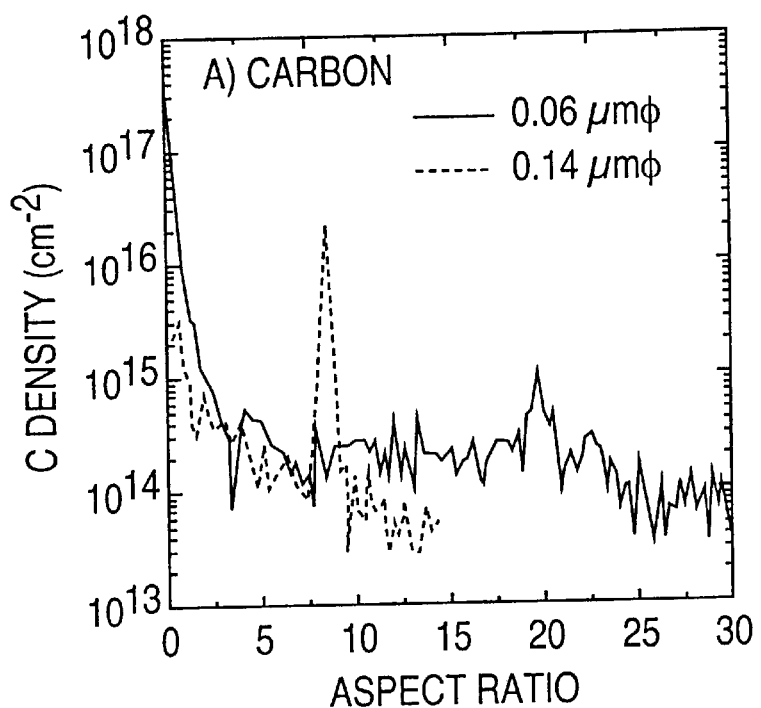
FIGS. 8A and 8B show the SIMS spectra of the polymer film in the contact hole when etching to diameters of 0.06 µm and 0.14 µm, respectively, in a third embodiment.
Figure 8B:
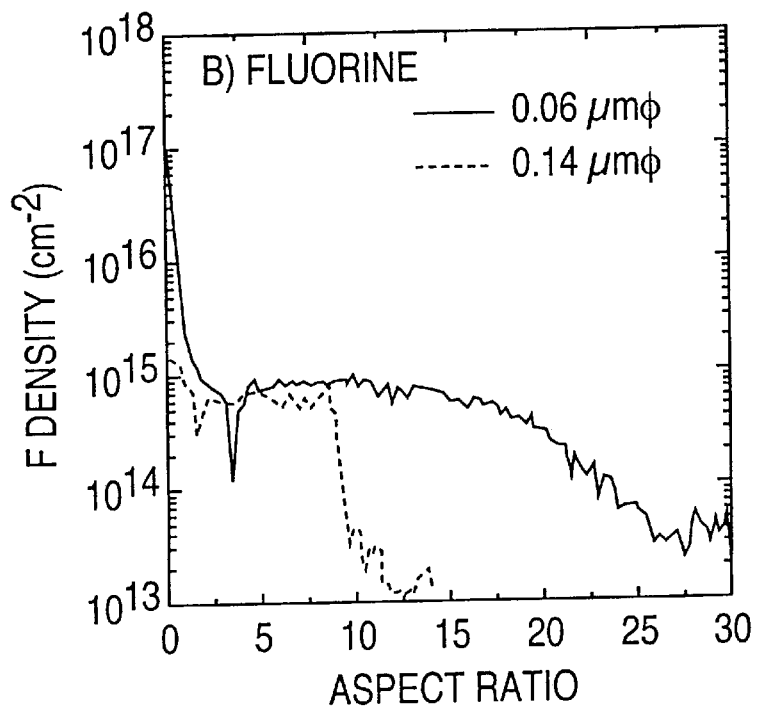

FIG. 8 shows the SIMS spectra of the polymer film in contact holes when etching was performed to make contact hole openings that have diameters of 0.06 $\mu$m and 0.14 $\mu$m, respectively, under a pressure of 25 mTorr at a mixing ratio (the mixing ratio of the Ar gas=94 flow percent (%)) of $C_4F_8/O_2/Ar$=20/10/500 (sccm). As in the case described in conjunction with FIG. 7, the profiles of the surface densities of C and F in the direction of the aspect ratio are shown in FIGS. 8A and 8B, respectively. In comparison with FIG. 7, the surface densities of C and F are extremely low; the surface density of C, in particular, is approximately 1/1000 when etching is carried out with a gas mixture composed of CHF3 and CO (FIG. 7).

Figure 9A:
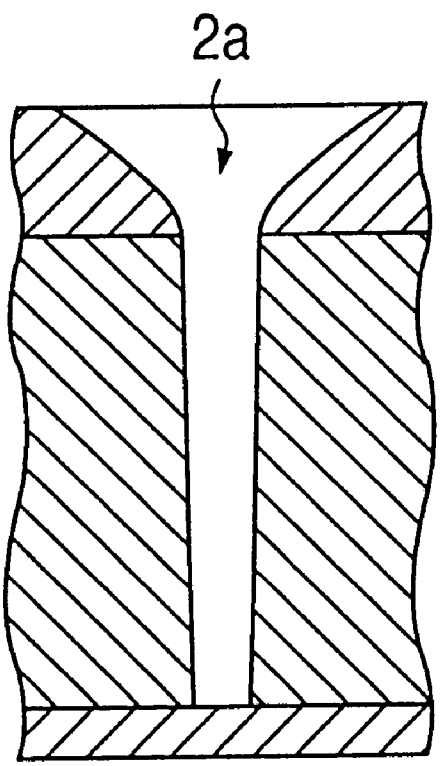
Figure 9B:
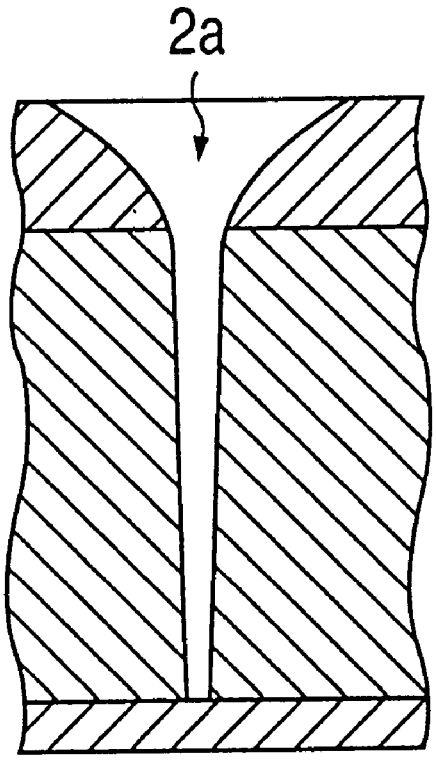

FIGS. 9A and 9B illustrate the sectional views (observed by an SEM) of the configurations of the sections of contact holes 2a having a diameter of 0.14 $\mu$m (FIG. 9A) and a diameter of 0.06 $\mu$m (FIG. 9B), respectively. As it is seen from FIG. 9, the perpendicular processing has been achieved. It is especially obvious that the contact hole having the 0.06-$\mu$m diameter (FIG. 9B) exhibits extremely high perpendicularity even in such a microminiature pattern. Thus, it is extremely important to optimize the distribution of the surface density of the polymer film accumulating on a hole side wall in the direction of the hole depth in order to accomplish the vertical processing of the contact hole having the 0.05-$\mu$m diameter without the etch stop. According to the results of the SIMS analysis, the essential conditions are as shown below.

(1) The surface density of C (the concentration of C) on a hole side wall is $1\times10^{15}$ $cm^{-2}$ or less; and
(2) The F/C ratio at a hole side wall is 1 or more.

The measurement results of the Ar mixing ratio and the SIMS profiles have indicated that the etching performed by setting the mixing ratio of the Ar gas at 90% or more when using the gas mixture composed of $C_4F_8$, $O_2$, and Ar shown in working example 3 satisfies the condition (1) or (2) above.

Working example 4 will now be described. As set forth in working example 3, using the gas mixture composed of $C_4F_8$, $O_2$, and Ar with the flow ratio of the Ar gas set at 90% or more permits the perpendicular processing of a microminiature contact hole having an opening diameter of about 0.05 $\mu$m. In working example 3, however, the selectivity for the polysilicon mask is low, presenting a problem in that, as the depth of the contact hole increases, the mask is damaged and the opening expands laterally before the hole bottom is reached. In working example 4, the substrate temperature during etching is set lower to solve the aforesaid low selectivity problem so as to achieve micro etching with a high aspect ratio.

Figure 10:
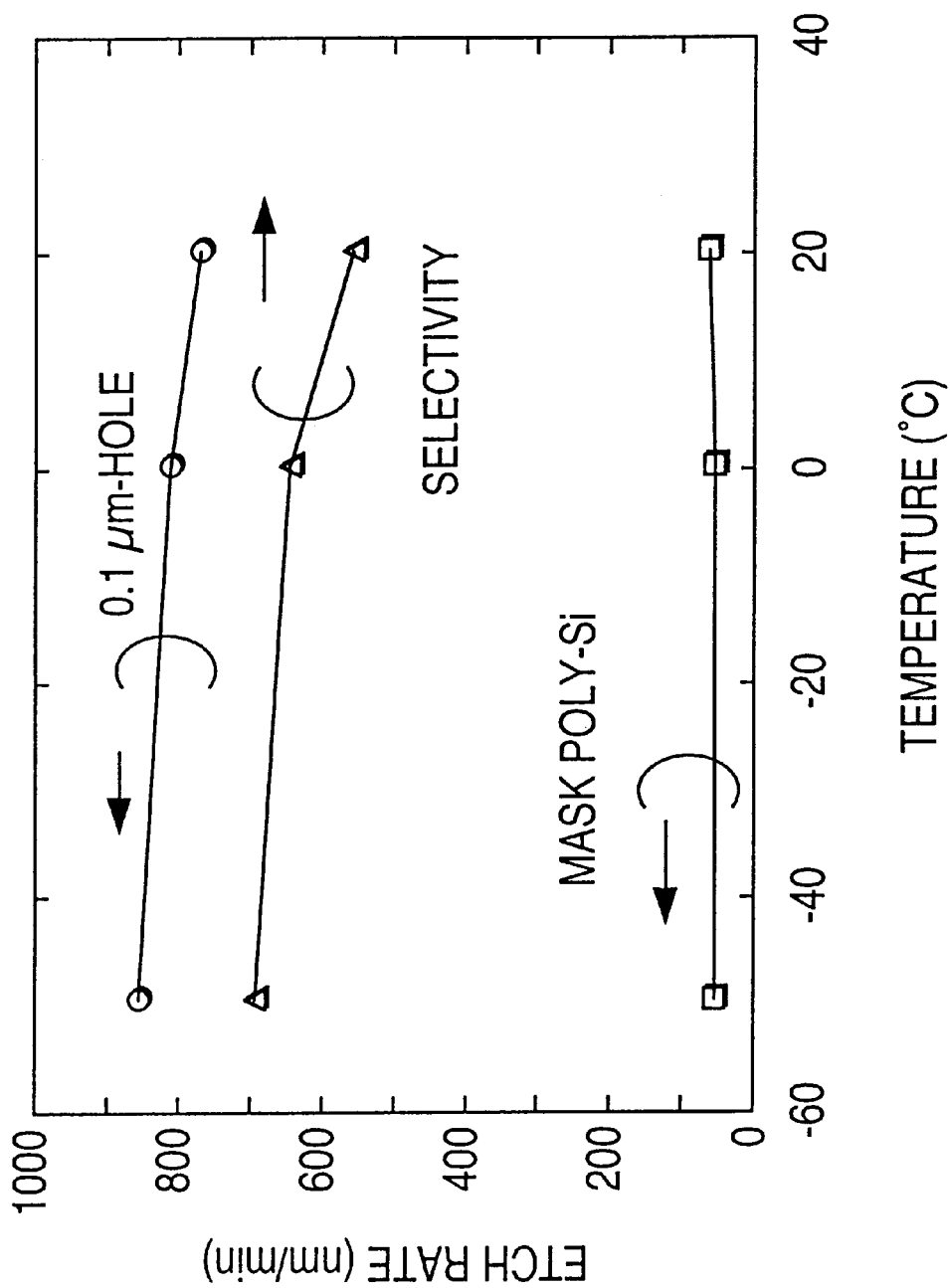
FIG. 10 is a graph illustrating the change in the etch rate in a contact hole of a 0.1 µm diameter, polysilicon mask etch rate, and the selectivity of both etch rates for each temperature of a substrate in a fourth embodiment.
Figure 11A:
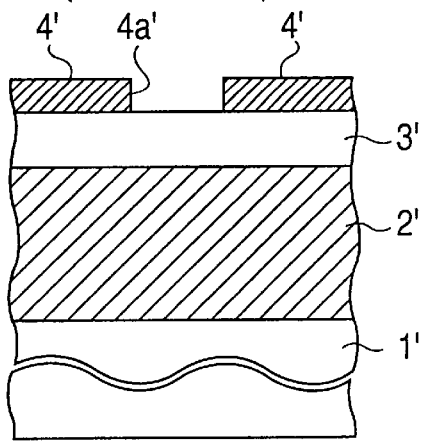
FIGS. 11A through 11E are schematic drawings illustrative of the steps in sequence of a conventional process for forming a contact hole having a microminiature opening diameter of 0.2 µm or less.
Figure 11D:
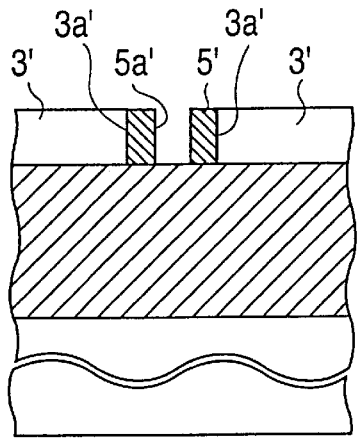
Figure 11B:
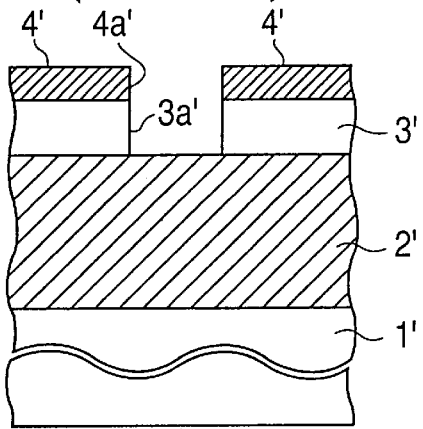
Figure 11E:
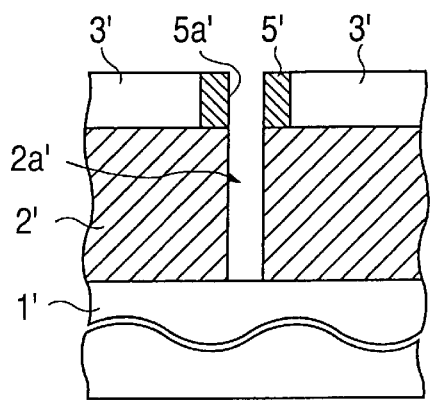
Figure 11C:
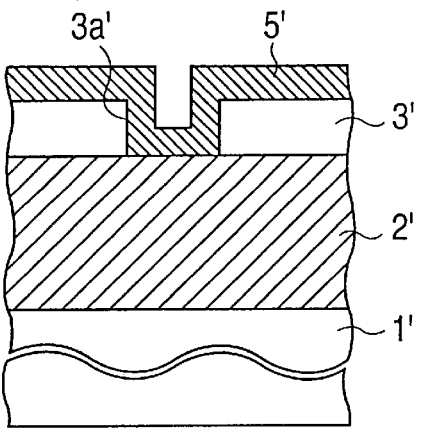
Figure 12:
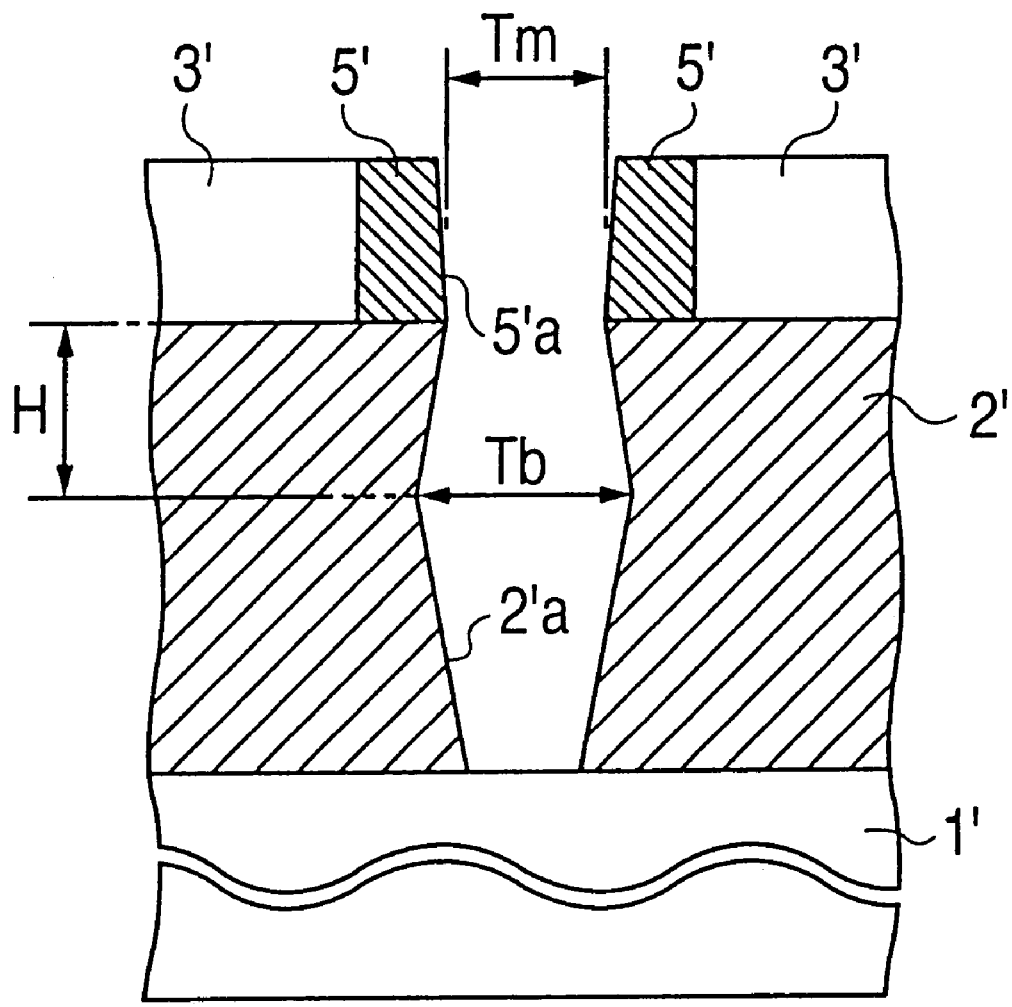
FIG. 12 is a schematic representation illustrative of a configuration defect due to bowing that has occurred in a contact hole formed using the conventional method.
Figure 13:
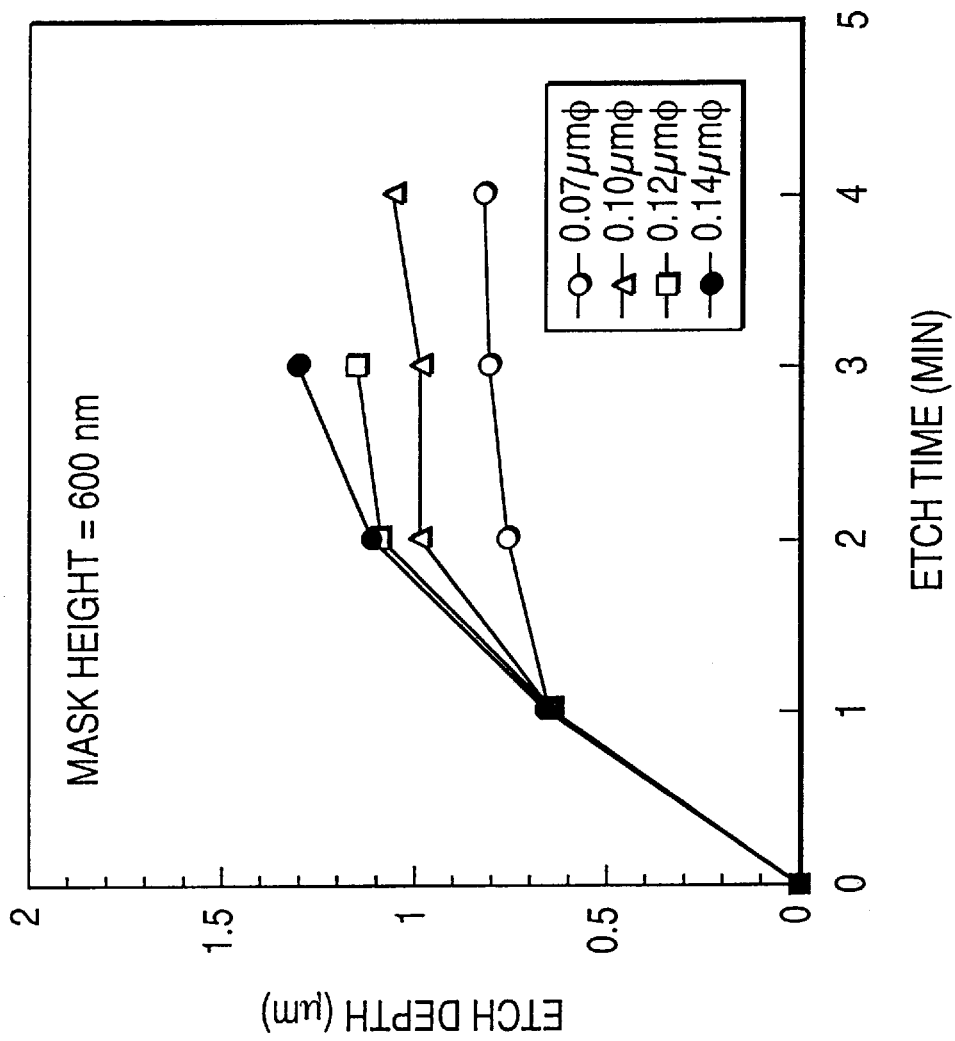
FIG. 13 is a graph illustrative of the relationship between the etch time and the etch depth in a contact hole when the mask height of a first polysilicon film is 600 nm in the conventional method.

FIG. 10 gives a graph showing the changes in the etch rate in a contact hole of a 0.1-$\mu$m diameter, the polysilicon mask etch rate, and the selectivity of both etch rates at different substrate temperatures. It is understood from the graph that, as the substrate temperature decreases, the etch rate of the polysilicon mask increases and the etch rate in the contact hole shows a marked increase, resulting in an increased selectivity with respect to the polysilicon mask. It has been confirmed from the experiment results that setting the substrate temperature to zero degree Celsius or lower makes it possible to etch a contact hole having an opening diameter of 0.05 μm to a depth of about 1.0 μm without posing a problem in practical use.

According to one aspect of the present invention, an opening can be formed without the bowing problem by employing the gas mixture composed of $CHF_3$ and CO as the etching gas and also employing the non-doped silicon oxide film as the insulating film.

Further, substantially perpendicular processing can be accomplished by setting the substrate temperature during etching at 50 degrees Celsius or higher.

According to another aspect of the present invention, the etch stop problem can be solved and a microminiature opening having a diameter of approximately 0.05 μm can be perpendicularly formed by employing the gas mixture composed of $C_4F_8$, $O_2$, and Ar with the mixing ratio of the Ar gas in the etching gas set at 90 flow percent (%) or more.

Further, the selectivity with respect to the polysilicon mask can be increased and a deep opening with a high aspect ratio can be formed by setting the substrate temperature at zero degree Celsius or lower.

Moreover, setting the mixing ratio of the Ar gas in the etching gas to 90 flow percent (%) or more allows etching to be carried out under the condition wherein the concentration of C of the polymer film accumulating on the side wall of an opening is $1\times10^{15}$ $cm^{-2}$ or less and the F/C ratio at the side wall of the opening is 1 or more, thus solving the etch stop problem.

What is claimed is:

1. A method for forming a contact hole, comprising:
   forming a hole opening in a first polysilicon film formed on an insulating film on a surface of a substrate;
   producing a second polysilicon film on an inner surface of said hole opening; and
   dry etching the insulating film to form the contact hole in the insulating film,
   a gas mixture consisting of $C_4F_8$, $O_2$, and Ar being used as an etching gas, and a mixing ratio of the Ar gas in the etching gas being set to 90 flow percent (%) or more,
   the dry etching resulting in formation of a polymer film on a side wall of the contact hole, the dry etching being carried out under a condition such that a concentration of C in the polymer film deposited on the side wall of the contact hole is $1\times10^{15}$ $cm^{-2}$ or less and an F/C concentration ratio in the polymer film on the side wall of the contact hole is 1 or more.

2. The method for forming a contact hole according to claim 1, wherein a temperature of the substrate during the dry etching is set at zero degree Celsius or lower.

3. The method for forming a contact hole according to claim 1, wherein the contact hole has a diameter of 0.1 μm or less.

4. The method for forming a contact hole according to claim 3, wherein the contact hole has a diameter of 0.05 μm.

5. A method for forming a contact hole comprising:
   forming a hole opening in a first polysilicon film formed on an insulating film on a surface of a substrate;
   producing a second polysilicon film on an inner surface of said hole opening; and
   dry etching the insulating film to form the contact hole in the insulating film,
   a gas mixture consisting of $C_4F_8$, $O_2$, and Ar being used as an etching gas, and a mixing ratio of the Ar gas in the etching gas being set to 90 flow percent (%) or more,
   the dry etching results in formation of a polymer film on a side wall of the contact hole, the dry etching being carried out under a condition wherein a concentration of C in the polymer film deposited on the side wall of the contact hole is $1\times10^{15}$ $cm^{-2}$ or less and an F/C concentration ratio in the polymer film on the side wall of the contact hole is 1 or more,
   a temperature of the substrate during the dry etching being set at zero degree Celsius or lower.

* * * * *